(12) United States Patent
Ryu

(10) Patent No.: US 9,223,650 B2
(45) Date of Patent: *Dec. 29, 2015

(54) SOLID STATE DISK CONTROLLER APPARATUS

(71) Applicant: SAMSUNG ELECTRONICS CO., LTD., Suwon-si, Gyeonggi-do (KR)

(72) Inventor: Dong-Ryul Ryu, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/543,549

(22) Filed: Nov. 17, 2014

(65) Prior Publication Data

US 2015/0067450 A1    Mar. 5, 2015

Related U.S. Application Data

(63) Continuation of application No. 13/419,673, filed on Mar. 14, 2012, now Pat. No. 8,917,565, and a continuation of application No. 12/491,813, filed on Jun. 25, 2009, now Pat. No. 8,159,889, and a continuation of application No. 11/311,990, filed on Dec. 19, 2005, now abandoned.

(30) Foreign Application Priority Data

Jan. 11, 2005 (KR) .................................. 2005-2611

(51) Int. Cl.
*G11C 29/00*     (2006.01)
*G06F 11/10*     (2006.01)
*G06F 3/06*      (2006.01)

(52) U.S. Cl.
CPC .......... *G06F 11/1068* (2013.01); *G06F 3/0619* (2013.01); *G06F 3/0659* (2013.01); *G06F 3/0679* (2013.01); *G06F 11/1008* (2013.01)

(58) Field of Classification Search
CPC ............ G06F 12/0246; G06F 13/4027; G06F 3/0601; G06F 3/0619; G06F 3/0658; G06F 3/0659; G06F 3/0674; G06F 3/0679; G06F 3/0688; G06F 3/061; G06F 11/1068; G06F 11/1072; G06F 11/1008; G06F 11/1076; H04L 12/2602; G06Q 10/10; G11C 29/00

See application file for complete search history.

(56) References Cited

U.S. PATENT DOCUMENTS 5,459,850 A * 10/1995 Clay et al. ..................... 711/171
5,917,538 A     6/1999 Asamizuya (Continued)

FOREIGN PATENT DOCUMENTS

JP    06-202821    7/1994
JP    08-234716    9/1996

(Continued)

*Primary Examiner* — Albert Decady
*Assistant Examiner* — Enamul M Kabir
(74) *Attorney, Agent, or Firm* — Volentine & Whitt, PLLC

(57) ABSTRACT

A solid state disk controller apparatus comprises a first port; a second port having a plurality of channels; a central processing unit connected to a CPU bus; a buffer memory configured to store data to be transferred from the second port to the first port and from the first port to the second port; a buffer controller/arbiter block connected to the CPU bus and configured to control read and write operations of the buffer memory based on a control of the central processing unit; a first data transfer block connected between the first port and the buffer controller/arbiter block and configured to transfer data to be stored/read in/from the buffer memory bypassing the CPU bus; and a second data transfer block connected between the second port and the buffer controller/arbiter block and configured to transfer data to be stored/read in/from the buffer memory bypassing the CPU bus.

17 Claims, 14 Drawing Sheets

(56) References Cited

U.S. PATENT DOCUMENTS

| | | | |
|---|---|---|---|
| 5,928,370 A * | 7/1999 | Asnaashari | 714/48 |
| 5,969,897 A | 10/1999 | Morita | |
| 6,069,827 A | 5/2000 | Sinclair | |
| 6,260,094 B1 | 7/2001 | Davis et al. | |
| 6,360,293 B1 | 3/2002 | Unno | |
| 6,401,149 B1 * | 6/2002 | Dennin et al. | 710/58 |
| 6,851,069 B1 | 2/2005 | Ahmad et al. | |
| 6,874,039 B2 | 3/2005 | Ganapathy et al. | |
| 7,814,554 B1 * | 10/2010 | Ragner | 726/27 |
| 8,159,889 B2 * | 4/2012 | Ryu | 365/198 |
| 8,917,565 B2 * | 12/2014 | Ryu | 365/198 |
| 2001/0017076 A1 | 8/2001 | Fujita et al. | |
| 2002/0038393 A1 | 3/2002 | Ganapathy et al. | |
| 2003/0028704 A1 | 2/2003 | Mukaida et al. | |
| 2003/0065899 A1 | 4/2003 | Gorobets | |
| 2003/0123287 A1 | 7/2003 | Gorobets | |
| 2004/0103242 A1 | 5/2004 | Teng | |
| 2004/0153597 A1 | 8/2004 | Kanai et al. | |
| 2005/0162990 A1 | 7/2005 | Murata | |
| 2007/0016702 A1 | 1/2007 | Pione et al. | |

FOREIGN PATENT DOCUMENTS

| | | |
|---|---|---|
| JP | 10-106148 | 4/1998 |
| JP | 11-511879 | 10/1999 |
| JP | 11-327798 | 11/1999 |
| JP | 2004-314423 | 11/2004 |
| KR | 1999-0063715 | 7/1999 |
| KR | 2001-0094034 | 10/2001 |
| KR | 2003-0035326 | 5/2003 |
| KR | 2004-0078110 | 9/2004 |
| WO | WO 97/12325 | 4/1997 |

* cited by examiner

SOLID STATE DISK CONTROLLER APPARATUS

CROSS REFERENCE TO RELATED APPLICATION

This is a Continuation of U.S. patent application Ser. No. 13/419,673, filed on Mar. 14, 2012, which is a Continuation of U.S. patent application Ser. No. 12/491,813, filed on Jun. 25, 2009, which is a Continuation of U.S. patent application Ser. No. 11/311,990, filed on Dec. 19, 2005, which claims priority under 35 U.S.C. §119 from Korean Patent Application No. 2005-2611, filed on Jan. 11, 2005, in the Korean Intellectual Property Office, the entire disclosures of each of which are herein incorporated by reference.

FIELD OF THE INVENTION

The present invention is related to electronic memory devices. In particular, the present invention is related to a solid state disk controller apparatus.

BACKGROUND

As known in the art, computer systems generally use several types of memory systems. For example, computer systems generally use so-called main memory comprising of semiconductor devices that can be randomly written to and read from with comparable and very fast access times and thus are commonly referred to as random access memories. However, since semiconductor memories are relatively expensive, other higher density and lower cost memories are often used. For example, other memory systems include magnetic disk storage systems. In the case of magnetic disk storage systems, generally, access times are in the order of tens of milliseconds. On the other hand, in the case of main memory, the access times are in the order of hundreds of nanoseconds. Disk storage is used to store large quantities of data which can be sequentially read into main memory as needed. Another type of disk-like storage is solid state disk storage (SSD, also called solid state drive). SSD is a data storage device that uses memory chips, such as SDRAM, to store data, instead of the spinning platters found in conventional hard disk drives.

The term "SSD" is used for two different kinds of products. The first type of SSD, based on fast, volatile memory such as SDRAM, is categorized by extremely fast data access and is used primarily to accelerate applications that are contained by the latency of disk drives. Since this SSD uses volatile memory, it typically incorporates internal battery and backup disk systems to ensure data persistence. If power is lost for whatever reason, the battery keeps the unit powered long enough to copy all data from RAM to backup disk. Upon the restoration of power, data is copied back from backup disk to RAM and the SSD resumes normal operation. The first type of SSD is especially useful on a computer which is already has the maximum amount of RAM. The second type of SSD uses flash memory to store data. These products, which have usually the same size as conventional storage, are typically used as low power, rugged replacements for hard drives. To avoid confusion with the first type, these disks are generally referred to as flash disks. The present invention is directed to the second type of SSD.

SUMMARY OF THE INVENTION

An object of the present invention is to provide a solid state disk controller apparatus capable of transferring data without limitation of a CPU bus speed.

In accordance with one aspect of the present invention, a solid state disk controller apparatus is provided which comprises a first port; a second port having a plurality of channels; a central processing unit connected to a CPU bus; and a buffer memory configured to store data to be transferred from the second port to the first port and from the first port to the second port. A buffer controller/arbiter block can be connected to the CPU bus and configured to control read and write operations of the buffer memory based on a control of the central processing unit. A first data transfer block can be connected between the first port and the buffer controller/arbiter block and configured to transfer data to be stored/read in/from the buffer memory in parallel to the CPU bus. A second data transfer block can be connected between the second port and the buffer controller/arbiter block and configured to transfer data to be stored/read in/from the buffer memory in parallel to the CPU bus.

Preferably either or both of the first and second data transfer block is/are operative to by pass the CPU bus in the transfer of data between the buffer and memory and the respective first and second ports.

The term "block" as used herein refers to electronic circuiting implements the described operations. Such circuitry can be implemented wholly by hand wire circuits, or by a combination of hardware, software and/or firmware.

In this embodiment, the first data transfer block can comprise a host interface control block connected to the CPU bus and configured to interface with an external host through the first port according to a control of the central processing unit; and a first FIFO configured to provide a data transfer path between the host interface control block and the buffer controller/arbiter block.

In this embodiment, the first port can comprise a first channel connected to an external host of a serial ATA interface type; a second channel connected to an external host of a parallel ATA interface type; a conversion block configured to convert data to be input through the first channel into a serial ATA format and data to be output through the first channel into a parallel ATA format; and a multiplexer configured to transfer data from the first channel or from the conversion block to the host interface control block, the multiplexer transferring data from the host interface block to either one of the second channel and the conversion block.

In this embodiment, the first port can be configured such that data from the first channel is directly transferred to the host interface control block and such that data from the host interface control block is directly transferred to the external host of the serial ATA interface type through the first channel.

In this embodiment, the second data transfer block can comprise a plurality of second FIFOs corresponding to the channels of the second port, respectively; and a memory interface control block connected to the CPU bus and configured to interface with semiconductor memories through the second port, wherein the plurality of second FIFOs are configured to provide data transfer paths between the memory interface control block and the buffer controller/arbiter block.

In this embodiment, the memory device can further comprise a plurality of ECC blocks connected to the second FIFOs respectively, the plurality of ECC blocks configured to detect errors of data transferred through the second FIFOs and to generate error correction codes of data transferred to the semiconductor memories.

In this embodiment, when an error is detected from data transferred through corresponding FIFOs, the ECC blocks can be configured to correct erroneous data without interference of the central processing unit.

In this embodiment, each of the channels of the second port can be connected with a plurality of non-volatile memories.

In this embodiment, the non-volatile memories connected to each channel of the second port can comprise a non-volatile memory having the same type.

In this embodiment, either the same types or different types of non-volatile memories can be connected to each channel of the second port.

In this embodiment, the second data transfer block can be configured to detect types of non-volatile memories connected to the channels of the second port at power-up and to control read and write operations of the non-volatile memories of each channel according to the detected result.

In this embodiment, the second data transfer block can be configured to control read and write operations of the semiconductor memories connected to the channels of the second port, based on either one of hardware and software interleave protocols when read and write operations are requested to the channels of the second port.

In this embodiment, the buffer controller/arbiter block can be configured to process data in a round-robin manner when the first and second FIFOs request data process operations.

In this embodiment, the memory interface control block can comprise a control logic configured to generate a first clock signal to be transferred to a semiconductor memory through the second port, the semiconductor memory outputting data in synchronization with the first clock signal; a delay circuit configured to delay the first clock signal and generate a second clock signal; and a data fetch register configured to fetch the data from the semiconductor memory in synchronization with the second clock signal.

In this embodiment, a delay time of the delay circuit can be determined by delay information from an exterior source.

In this embodiment, the memory interface control block can further comprise a register for storing delay information that is used to determine a delay time of the delay circuit.

In accordance with another aspect of the present invention, a solid state disk controller apparatus is provided which a first port; a second port having a plurality of channels; a central processing unit connected to a CPU bus; and a buffer memory configured to store data to be transferred from the second port to the first port or from the first port to the second port. A host interface control block can be connected to the first port and the CPU bus and configured to interface with an external host according to a control of the central processing unit. A buffer controller/arbiter block can be connected to the CPU bus and configured to control the buffer memory according to a control of the central processing unit. A first FIFO can be configured to provide a data transfer path between the host interface control block and the buffer controller/arbiter block. A memory interface control block can be connected to the second port and the CPU bus and configured to interface with non-volatile memories according to a control of the central processing unit. A plurality of second FIFOs can be configured to provide data transfer paths between the memory interface control block and the buffer controller/arbiter block.

In this embodiment, the memory device can further comprise a plurality of ECC blocks connected to the second FIFOs respectively, the plurality of ECC blocks configured to detect errors of data transferred through corresponding second FIFOs and to generate error correction codes of data transferred to the non-volatile memories.

In this embodiment, when an error is detected from data transferred through corresponding second FIFOs, the ECC blocks can be configured to correct erroneous data without interference of the central processing unit.

In this embodiment, non-volatile memories connected to each channel of the second port can comprise non-volatile memories having the same types with each other.

In this embodiment, either the same types or different types of non-volatile memories can be connected to each channel of the second port.

In this embodiment, the memory interface control block can be configured to detect types of non-volatile memories connected to the channels of the second port at power-up and to control read and write operations of the non-volatile memories of each channel according to the detected result.

In this embodiment, the memory interface control block can be configured to control read and write operations of the non-volatile memories connected to the channels of the second port, based on either one of hardware and software interleave protocols when read and write operations are requested to the channels of the second port.

In this embodiment, the buffer controller/arbiter block can be configured to process data in a round-robin manner when the first and second FIFOs request data process operations.

In this embodiment, the memory interface control block can comprise a control logic configured to generate a first clock signal to be transferred to a semiconductor memory through the second port, the semiconductor memory outputting data in synchronization with the first clock signal; a delay circuit configured to delay the first clock signal and generate a second clock signal; and a data fetch register configured to fetch the data from the semiconductor memory in synchronization with the second clock signal.

In this embodiment, a delay time of the delay circuit can be determined by delay information from an exterior source.

In this embodiment, the memory interface control block can further comprise a register for storing delay information that is used to determine a delay time of the delay circuit.

BRIEF DESCRIPTION OF THE DRAWINGS

A more complete appreciation of the present invention, and many of the attendant advantages thereof, will become readily apparent from the following detailed description when considered in conjunction with the accompanying drawings in which like reference symbols indicate the same or similar components, wherein.

DESCRIPTION OF A PREFERRED EMBODIMENT

A preferred embodiment of the invention will be more fully described with reference to the attached drawings.

Figure 1:
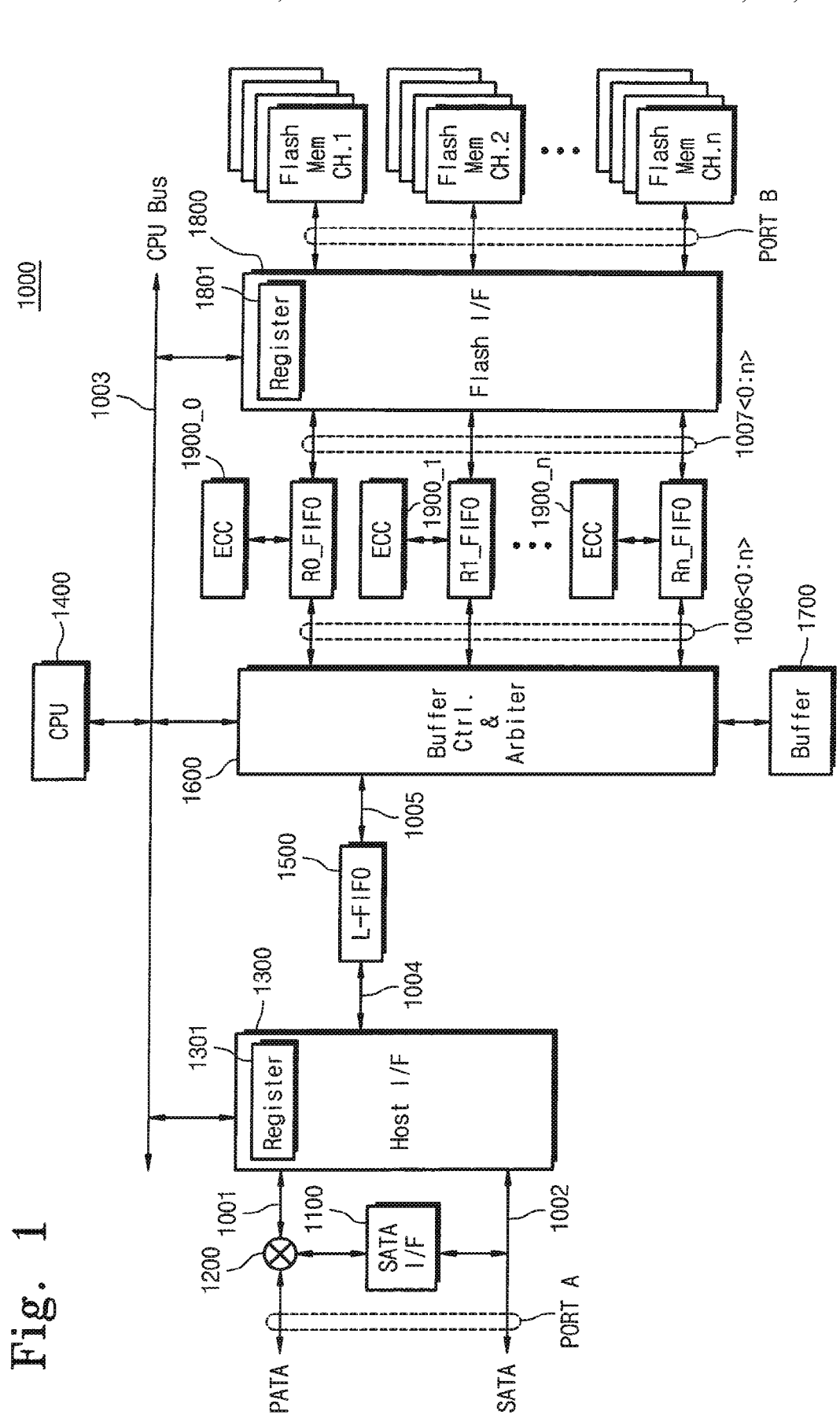
FIG. 1 is a block diagram showing an embodiment of a solid state disk controller apparatus according to the present invention.

FIG. 1 is a block diagram showing a solid state disk controller apparatus according to a preferred embodiment of the present invention. A solid state disk controller apparatus 1000 comprises a first port (PORT A) and a second port (PORT B). The solid state disk controller apparatus 1000 exchanges data with an external host (not shown) through the first port PORT A. The first port comprises two channels: a parallel AT attachment (PATA) bus 1001 and a serial AT attachment (SATA) bus 1002. The second port PORT B comprises a plurality of channels, each of which is electrically connected to a plurality of non-volatile memories. Herein, the same types of memories are connected to each channel. A non-volatile memory connected to one channel comprises a single-level flash memory, a multi-level flash memory, a OneNAND flash memory (it is a single chip in which a flash memory core and memory control logic are integrated), or the like. For example, single-level flash memories are connected to one channel, multi-level flash memories are connected to another channel, and OneNAND flash memories are connected to the other channel. A SATA interface (in FIG. 1, marked by "SATA I/F") 1100 is called a device dongle and converts serial/parallel data into parallel/serial data. For example, the SATA interface 1100 receives serial data transferred through a SATA bus 1002 and converts the received serial data into parallel data. The SATA interface 1100 converts parallel data from a multiplexer 1200 into serial data. The multiplexer 1200 transfers parallel data provided through the PATA bus 1001 to the host interface control block 1300. The multiplexer 1200 transfers data from the host interface control block 1300 to the PATA bus 1001 or the SATA interface 1100. It is previously determined whether anyone of the PATA bus 1001 and the SATA bus 1002 of the first port is used.

Continuing to refer to FIG. 1, the host interface control block 1300 is connected to the PATA bus 1001 (or, called "an internal IDE bus"), the SATA bus 1002, and a CPU bus 1003. The host interface control block 1300 performs an interface operation according to a control of a central processing unit (CPU) 1400. Data to be input/output through the host interface control block 1300 is stored in a buffer memory 1700 through a buffer controller/arbiter block 1600 and a FIFO (L_FIFO) 1500, without passing through the CPU bus 1003. For example, externally input data is stored in the buffer memory 1700 through the host interface control block 1300, the L_FIFO 1500, and the buffer controller/arbiter block 1600 under the control of the CPU 1400. Likewise, stored data in the buffer memory 1700 is output to the exterior through the buffer controller/arbiter block 1600, the L_FIFO 1500, and the host interface control block 1300.

A data transfer operation of the solid state disk controller apparatus 1000 can be carried out without using the CPU bus 1003, so that a data transfer speed is not affected by a CPU bus speed.

The L FIFO 1500 is connected between the host interface control block 1300 and the buffer controller/arbiter block 1500. In a case where bandwidths of the internal buses 1004 and 1005 are different from each other, the L_FIFO 1500 is used to temporarily store data that is not processed while data is transferred. The size of the L_FIFO 1500 is determined such that the L_FIFO 1500 is not filled up during a data transfer operation. The host interface control block 1300 comprises a register 1301, in which operating commands and addresses from the exterior are stored. The host interface control block 1300 communicates a write or read operation to the CPU 1400 through the CPU bus 1003 in response to stored information in the register 1301. The CPU 1400 controls the host interface control block 1300 and the buffer controller/arbiter block 1600 based on input information. This will be more fully described below.

A flash interface control block 1800 exchanges data with external non-volatile memories through a second port. The flash interface control block 1800 is configured to support the NAND flash memories, the One_NAND flash memories, and multi-level flash memories. The flash interface control block 1800 comprises a predetermined number of channels. A channel can be connected with any of a plurality of non-volatile memories. Channels can be connected with the same types of memories or can be connected with different types of memories. In addition, in a case in which various types of non-volatile memories are connected to the second port, the solid state disk controller apparatus 1000 supports a function for diagnosing types of non-volatile memories, connected to the second port, at booting. This function is easily accomplished by means of a well-known read operation for device ID. When read and program operations are carried out to different channels, the flash interface control block 1800 of the present solid state disk controller apparatus 1000 selectively performs software and hardware interleave operations.

Data transferred through the flash interface control block 1800 is stored in the buffer memory 1700 through a FIFO Ri_FIFO (i=0-n) and the buffer controller/arbiter block 1600.

Data transferred through the flash interface control block 1800 is stored in the buffer memory 1700 through a FIFO Ri_FIFO (i=0-n) and the buffer controller/arbiter block 1600, without passing through the CPU bus 1003. For example, data input through the second port is stored in the buffer memory 1700 through the flash interface control block 1800, the Ri_FIFO, and the buffer controller/arbiter block 1600 under the control of the CPU 1400. Likewise, stored data in the buffer memory 1700 is transferred to the second port through the buffer controller/arbiter block 1600, the Ri_FIFO, and the flash interface control block 1800 under the control of the CPU 1300. A data transfer operation of the solid state disk controller apparatus 1000 can be carried out without using of the CPU bus 1003, so that its data transfer speed is not affected by the CPU bus speed. The FIFOs R0_FIFO-Rn_FIFO are connected between the flash interface control block 1800 and the buffer controller/arbiter block 1600. In a case in which bandwidths of the internal buses 1006<n:0> and 1007<n:0> are different from each other, the FIFOs R0_FIFO-Rn_FIFO are used to temporarily store data that is not processed while data is transferred. The size of each of the FIFOs R0_FIFO-Rn_FIFO is determined such that each of the FIFOs Ri FIFO is not filled up during a data transfer operation.

The buffer controller/arbiter block 1600 is configured to control read and write operations of the buffer memory 1700. For example, the buffer controller/arbiter block 1600 stores data input through the L_FIFO or the Ri_FIFO in the buffer memory 1700. The buffer controller/arbiter block 1600 reads out from the buffer memory 1700 data to be written to a non-volatile memory or to be output to the exterior. The buffer controller/arbiter block 1600 is configured to process data in a round-robin way when data processing requests coincide. In this case, it is preferable to limit the amount of data to be processed at once so that it does not take a long time to process any request. The buffer controller/arbiter block 1600 has enough data processing ability to process simultaneous requests of the FIFOs R0_FIFO-Rn_FIFO. That is, data process capacity is identical to or larger than a total bandwidth (L_FIFO+R0_FIFO+ . . . +Rn_FIFO).

Error checking and correction (ECC) blocks 1900_0-1900_n are respectively connected to the FIFOs R0_FIFO-Rn_FIFO which are connected in parallel between the buffer controller/arbiter block 1600 and the flash interface control block 1800. When data is transferred from the flash interface control block 1800 to the buffer memory 1700 through any FIFO (e.g., RO_FIFO), an ECC block 1900_0 corresponding to the R0_FIFO carries out an error detecting operation for data transferred through the R0_FIFO. If an error is detected from the transferred data, the ECC block 1900_0 is configured to request error correction to the buffer controller/arbiter block 1600 and to correct erroneous data in the buffer memory 1700. Each of the ECC blocks 1900_0-1900_n generates ECC data when main data is transferred to the flash interface control block 1800 through a corresponding FIFO. ECC data thus generated is stored in a non-volatile memory, connected to the second port, with the main data under the control of the flash interface control block 1800.

The buffer memory 1700 is used to store data to be transferred to the exterior (e.g., an external host or a non-volatile memory). In addition, the buffer memory 1700 is used to store programs operated by the CPU 1400. The buffer memory 1700 preferably consists of SRAM. The buffer memory 1700 can consist of both SRAM for storing data to be transferred to the exterior and SRAM for storing programs and data operated by the CPU 1400. But, it is obvious to one skilled in the art that the type and allocation of buffer memory are not limited to the specific example of this disclosure.

The CPU 1400 generates a command by use of values in control registers 1301 and 1801 in the control blocks 1300 and 1800. The CPU 1400 sets the control registers 1301 and 1801 with control information for read and write operations. For example, when a read/write command is received from the exterior, it is stored in the register 1301 of the host interface control block 1300. The host interface control block 1300 informs the CPU 1400 that a read/write command is received, based on the stored command in the register 1301. The CPU 1400 controls the blocks 1300 and 1600 according to a read/write command. In addition, the CPU 1400 stores a read/write command in the register 1801 of the flash interface control block 1800. The flash interface control block 1800 controls a read/write operation of non-volatile memories through the second port based on the stored command in the register 1801.

In accordance with this embodiment of the present invention, when a read/write operation for non-volatile memories connected to the second port is required, a data transfer operation is carried out not through the CPU bus 1003 in the solid state disk controller apparatus 1000, but through a FIFO path. That is, data transferring from the first port to the second port (or from the second port to the first port) can be carried out without using the CPU bus 1003, so that a data transfer speed of the present solid state disk controller apparatus 1000 is not affected by a speed of the CPU bus 1003.

Figure 2:
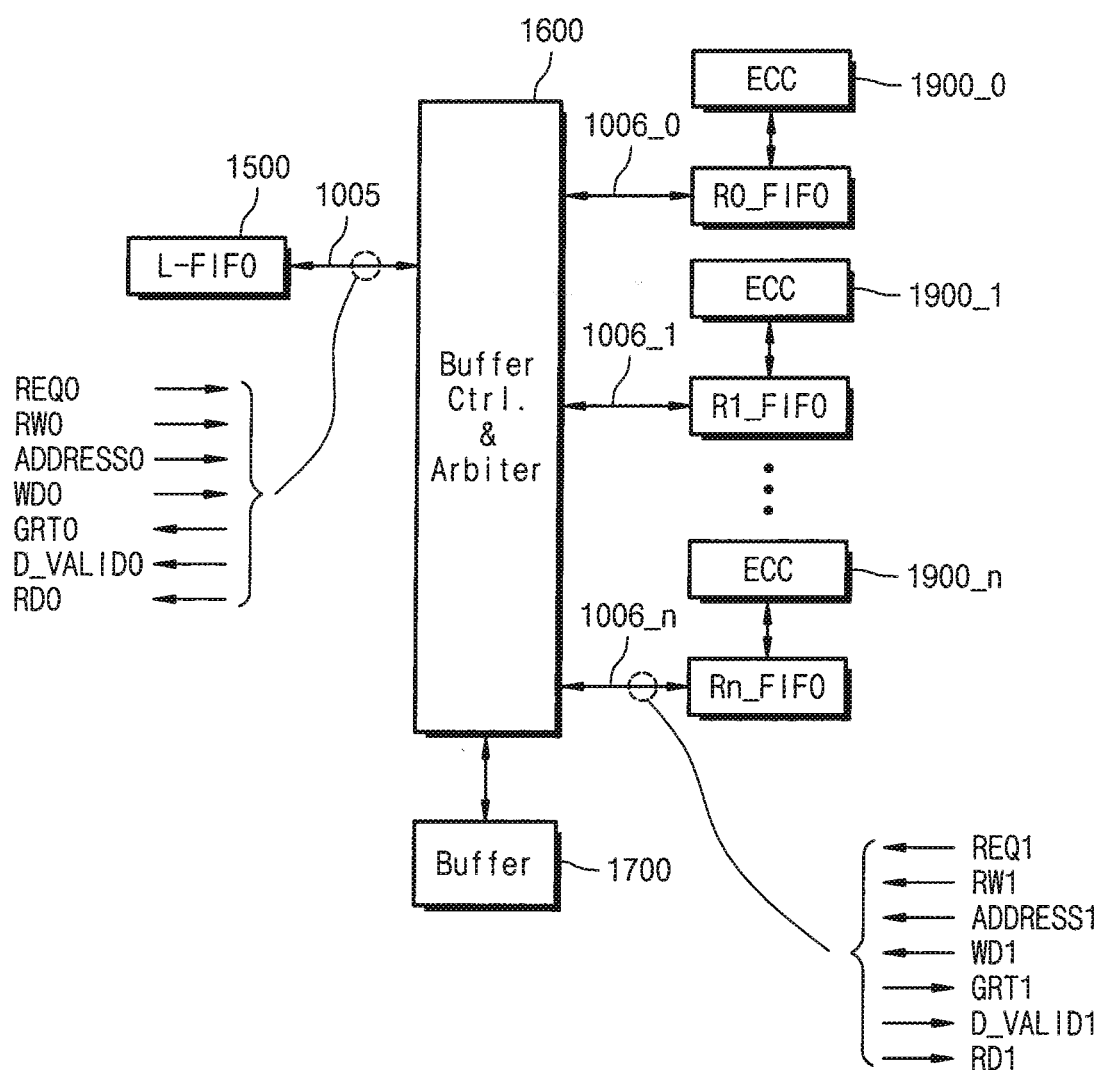
FIG. 2 is a block diagram showing a bus architecture for connecting a buffer controller/arbiter block and FIFOs in FIG. 1.
Figure 3A:
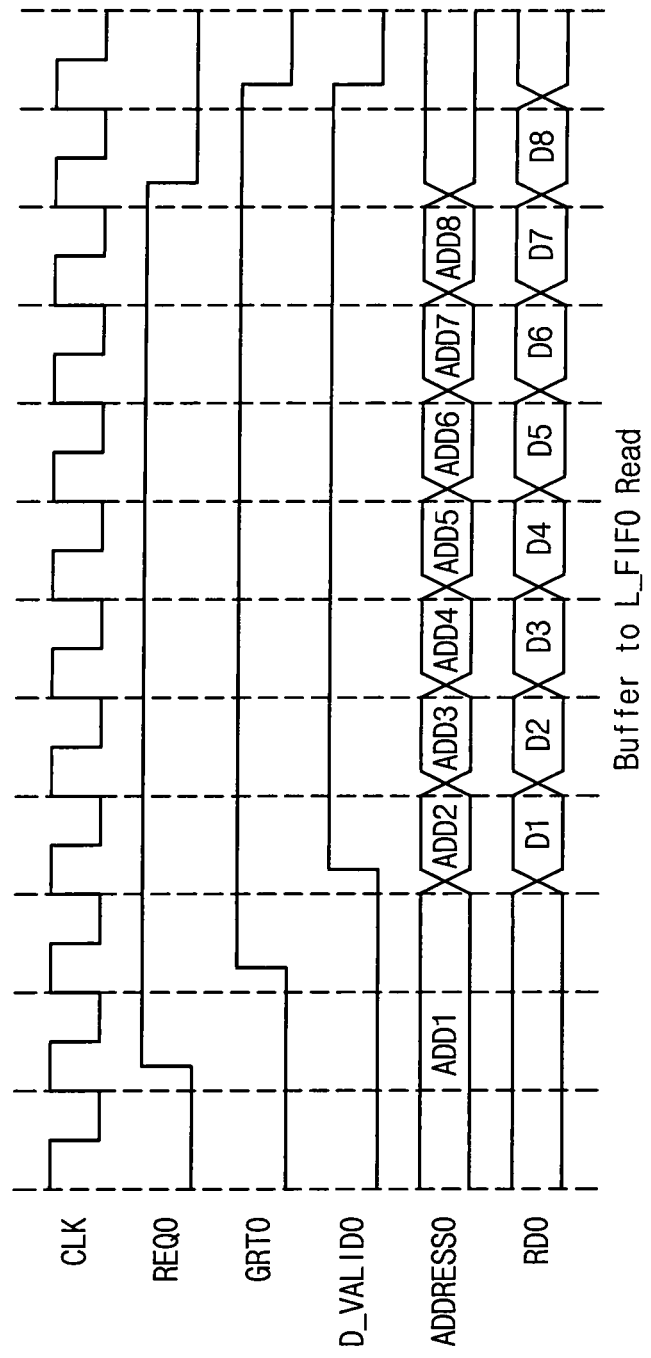
FIGS. 3A and 3B are timing diagrams for describing operations of a buffer controller/arbiter block and FIFOs.
Figure 3B:
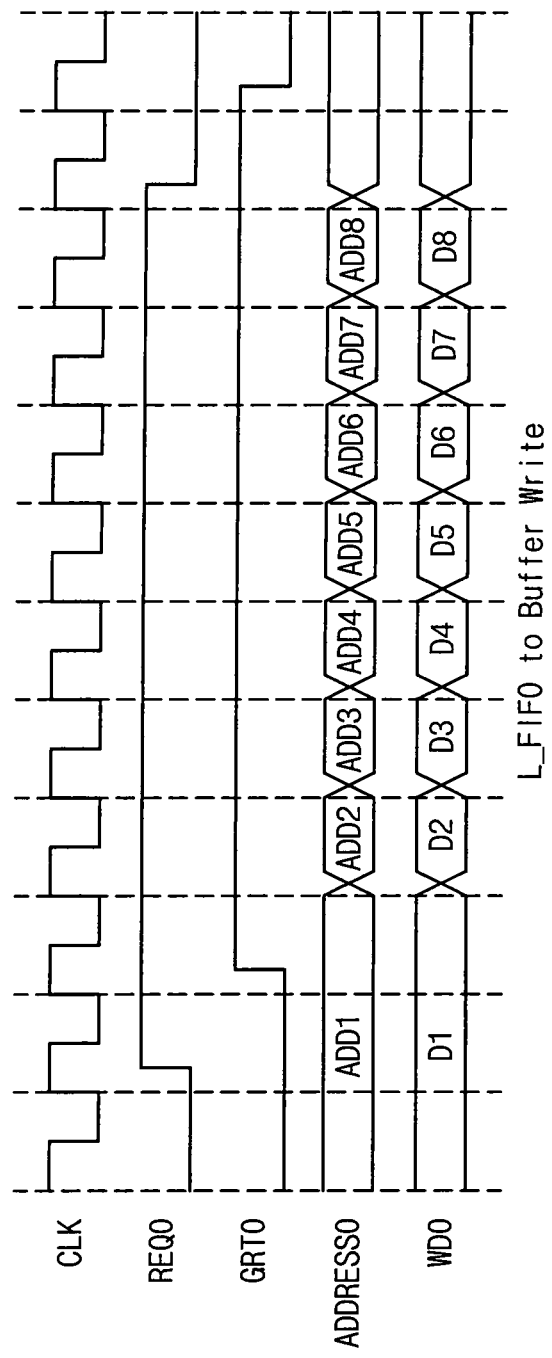

FIG. 2 is a block diagram showing the bus architecture for connecting a buffer controller/arbiter block and FIFOs in FIG. 1, and FIGS. 3A and 3B are timing diagrams for describing operations of the buffer controller/arbiter block and the FIFOs.

Referring to FIG. 2, buffer controller/arbiter block 1600 is configured to acknowledge the data processing request when a data processing operation is requested from FIFOs L_FIFO and R0_FIFO-Rn_FIFO. A bus between the L_FIFO and the buffer controller/arbiter block 1600 is configured to transfer a request signal REQ0, a grant signal GRT0, a read/write distinction signal RW0, an address ADDRESS0, read data RD0, write data WD0, and a data valid interval signal D_VALID0. Likewise, each of buses 1006_0-1006_n between the FIFOs R0_FIFO-Rn_FIFO and the buffer controller/arbiter block 1600 is configured to transfer a request signal REQ1, a grant signal GRT1, a read/write distinction signal RW1, an address ADDRESS 1, read data RD1, write data WD 1, and a data valid interval signal D_VALID 1.

In the case of transferring data from the buffer memory 1700 to the L_FIFO, as illustrated in FIG. 3A, the L_FIFO activates a request signal REQ0 for a read operation. At the same time, an address ADDRESS0 of data to be read is transferred from the L_FIFO to the buffer controller/arbiter block 1600. When the request signal REQ0 is activated, the buffer controller/arbiter block 1600 activates the grant signal GRT0 when a previous process is ended. As the data processing request is granted, the L_FIFO sequentially sends addresses to the buffer controller/arbiter block 1600. The buffer controller/arbiter block 1600 reads data from the buffer memory 1700 according to received addresses and outputs the read data to the L_FIFO during activation of a valid data interval signal D_VALID0. At this time, the L_FIFO inactivates the request signal REQO when a predetermined amount of data (e.g., eight N-bit data) is received. This inactivation enables the buffer controller/arbiter block 1600 to process the request of another FIFO.

In the case of transferring data from the L_FIFO to the buffer memory 1700, as illustrated in FIG. 3B, the L_FIFO activates the request signal REQ0 for a write operation. When the request signal REQ0 is activated, the buffer controller/arbiter block 1600 activates the grant signal GRT0 when a previous process is ended. As the data processing request is granted, the L FIFO sequentially sends addresses with data to be written to the buffer controller/arbiter block 1600. The buffer controller/arbiter block 1600 writes received data in the buffer memory 1700 according to received addresses. At this time, the L_FIFO inactivates the request signal REQO when a predetermined amount of data (e.g., eight N-bit data) is output. This inactivation enables the buffer controller/arbiter block 1600 to process the request of another FIFO.

Data transfer from the buffer memory 1700 to a Ri_FIFO via a bus 1006_i is carried out in the same manner as illustrated in FIG. 3A, and data transfer from a Ri_FIFO via a bus 1006_i to the buffer memory 1700 is carried out in the same manner as illustrated in FIG. 3B. Thus, a description of read and write operations related to the FIFOs R0_FIFO-Rn_FIFO is omitted.

Figure 4:
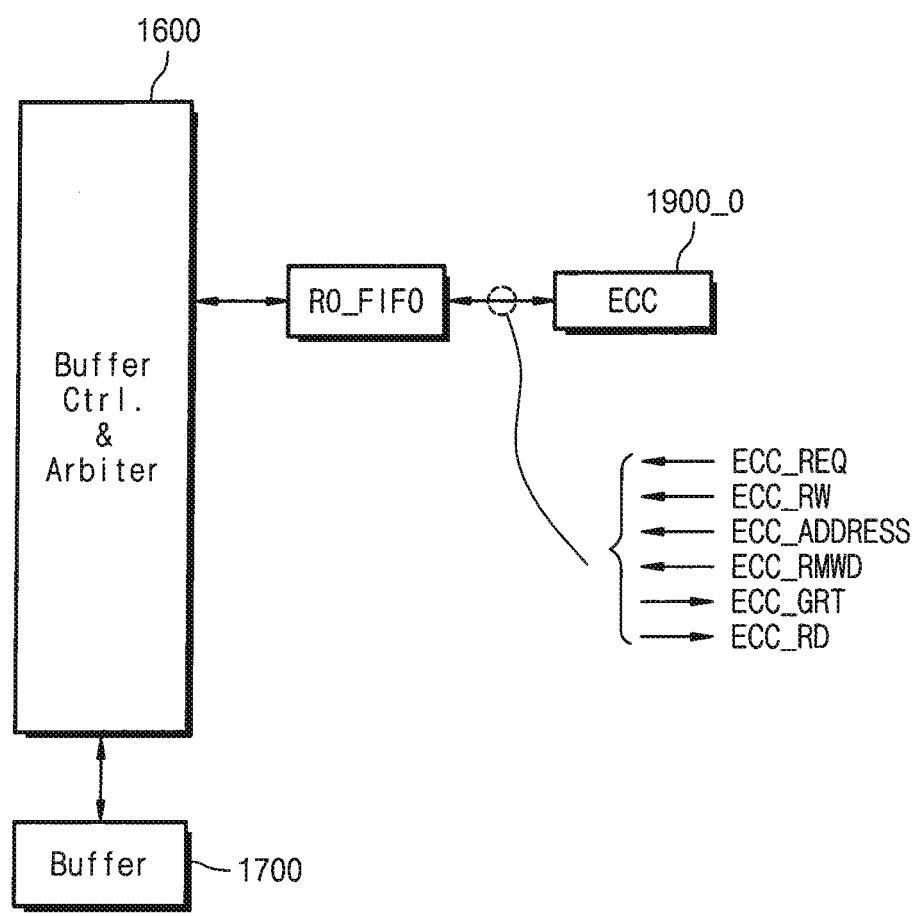
FIG. 4 is a block diagram showing a bus architecture of an ECC block in FIG. 1.
Figure 5:
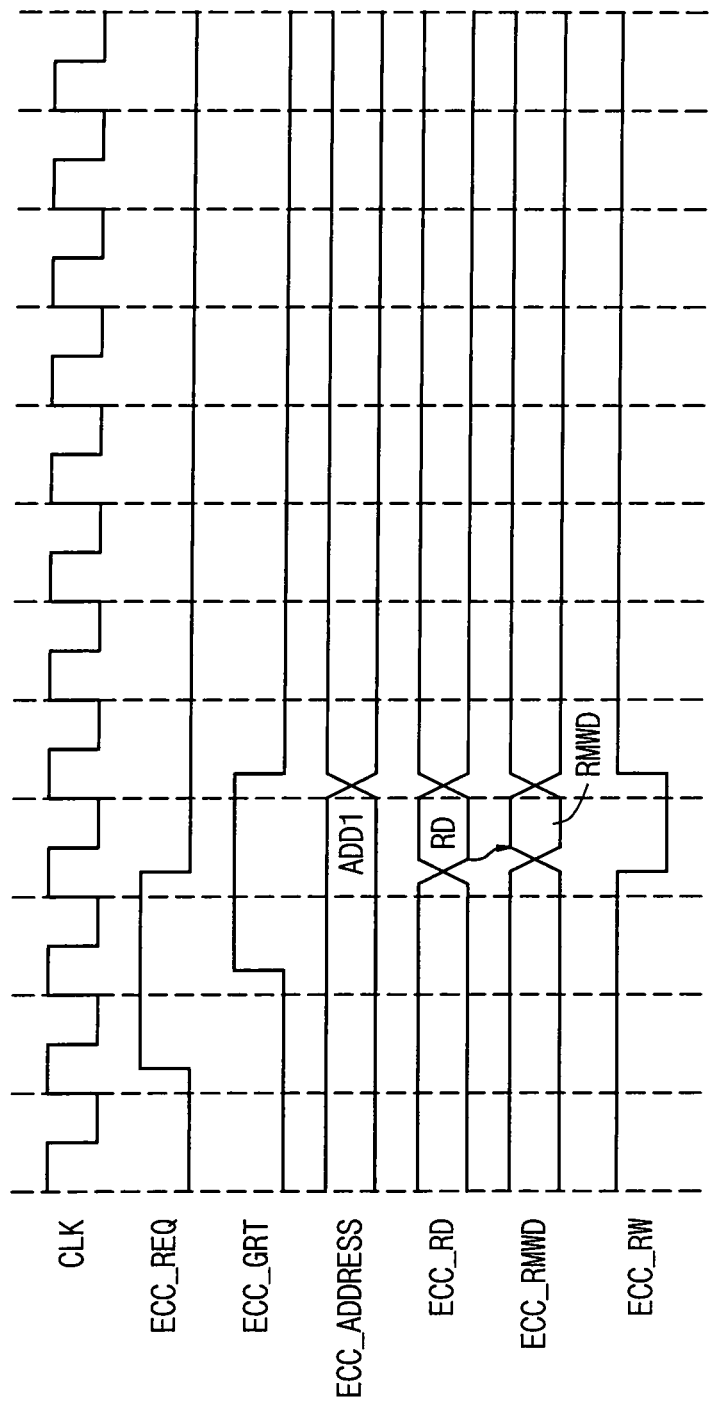
FIG. 5 is a timing diagram for describing error detecting and correcting operations of an ECC block in FIG. 1.

FIG. 4 is a block diagram showing the bus architecture of an ECC block in FIG. 1, and FIG. 5 is a timing diagram for describing an error detecting and correcting operation of an ECC block.

Referring to FIG. 4, an exemplary bus for connecting an ECC block 1900_0 and a R0_FIFO is configured to transfer an ECC request signal ECC_REQ, ECC read/write distinction signal ECC_RW, an ECC address ECC_ADDRESS, ECC remedy data ECC_RMWD, an ECC grant signal ECC_GRT, and ECC read data ECC_RD.

Assume that data is transferred to buffer memory 1700 through R0_FIFO. If an error is detected from transferred data, ECC block 1900_0 activates an ECC request signal ECC_REQ, which is transferred to the buffer controller/arbiter block 1600 through the R0_FIFO with an ECC address ADD1 of erroneous data. The buffer controller/arbiter block 1600 activates the grant signal ECC_GRT when the request signal ECC_REQ is received together with the address ADD1. At this time, the ECC read/write distinction signal ECC_RW is maintained high so as to indicate a read operation. When the ECC read/write distinction signal ECC_RW is ATA high level, erroneous data is read from the buffer memory 1700 under the control of the buffer controller/arbiter block 1600. The erroneous data ECC RD thus read is transferred to the ECC block 1900_0 through the R0_FIFO. The erroneous data ECC RD is corrected by the ECC block 1900_0, and the error-corrected data ECC RMWD is transferred to the buffer controller/arbiter block 1600 through the R0_FIFO. At this time, the ECC read/write distinction signal ECC_RW goes to a low level indicating a write operation. The buffer controller/arbiter block 1600 stores the error-corrected data ECC_RWMD in the buffer memory 1700 in response to the ECC read/write distinction signal ECC_RW. Afterwards, the buffer controller/arbiter block 1600 inactivates the grant signal ECC_GRT.

Figure 6:
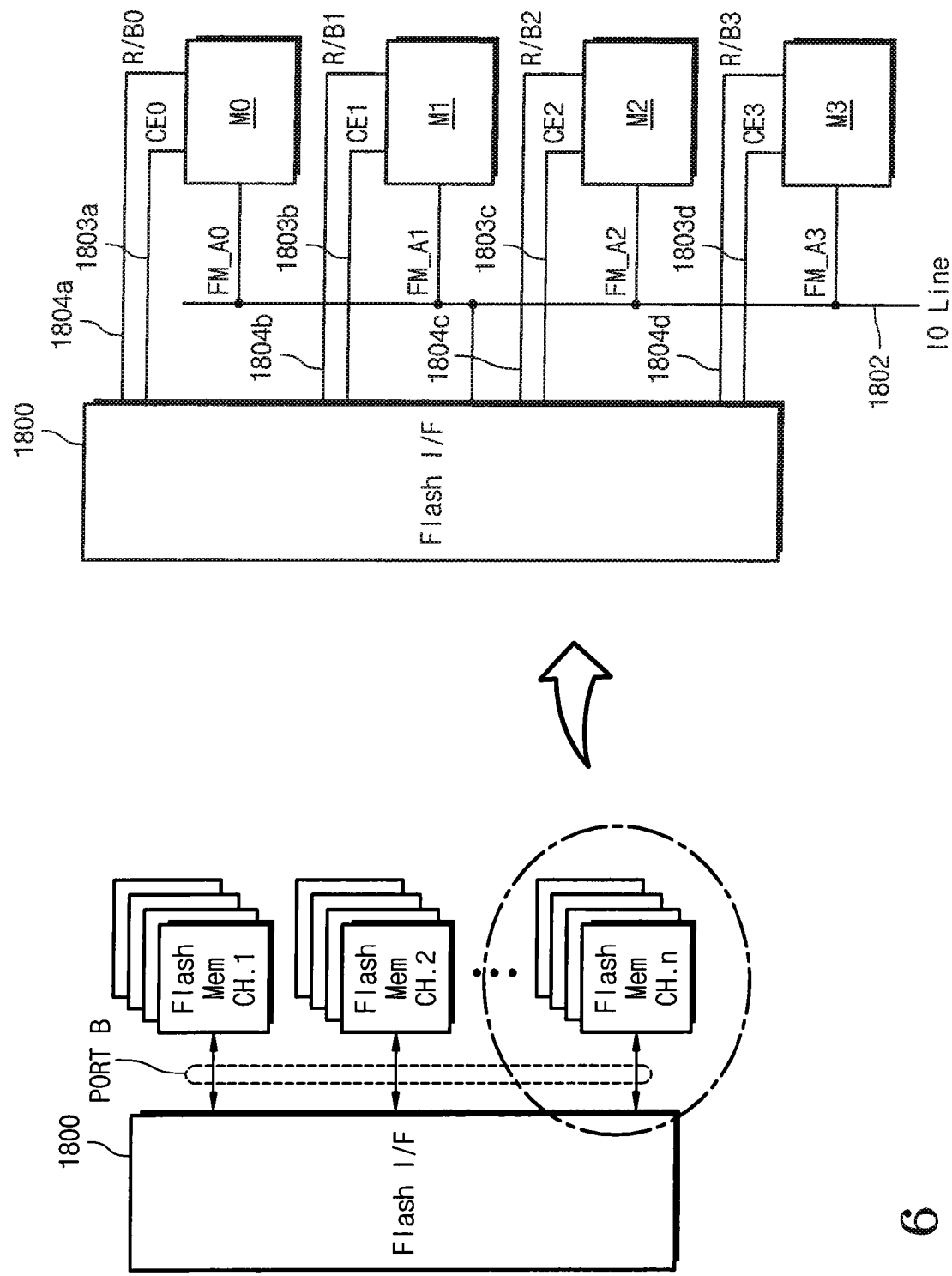
FIG. 6 is a block diagram showing one of n channels of a flash interface control block in FIG. 1.

FIG. 6 is a block diagram showing one of the channels of a flash interface control block in FIG. 1.

Referring to FIG. 6, one channel is connected with a plurality of non-volatile memories. In this example, the non-volatile memories consist of NAND flash memories. As well known in the art, the NAND flash memory has a command/address/data multiplexed I/O structure. This means that commands, data, and addresses are provided through input/output pins. Assuming that one channel is connected with four non-volatile memories, it comprises input/output lines 1802 commonly connected to memories M0, M1, M2 and M3, four chip enable signal lines 1803a-1803d respectively connected to corresponding memories, and four ready/busy signal lines 1804a-1804d respectively connected to corresponding memories. In addition, although not shown in this figure, control signals such as /WE, /RE, CLE, ALE, etc. are commonly provided to the memories M0-M3.

Assume that four flash memories M0-M3 are connected to one channel. Under this assumption, write operations of hardware and software interleave protocols will be more fully described below. In order to perform a write operation, a CPU 1400 stores a write command in a register 1801 of a flash interface control block 1800 through a CPU bus 1003 (see FIG. 1). The flash interface control block 1800 performs a write operation for flash memories in response to the stored write command in the register 1801. In the case of the above-described channel structure, if the number of sectors to be written is over 2, write operations for flash memories are preferably carried out according to hardware and software interleave protocols. Firstly, a write operation of the hardware interleave protocol will be described with reference to FIG. 7. A timing diagram for describing a write procedure according to 4-way interleaving is illustrated in FIG. 7.

Figure 7:
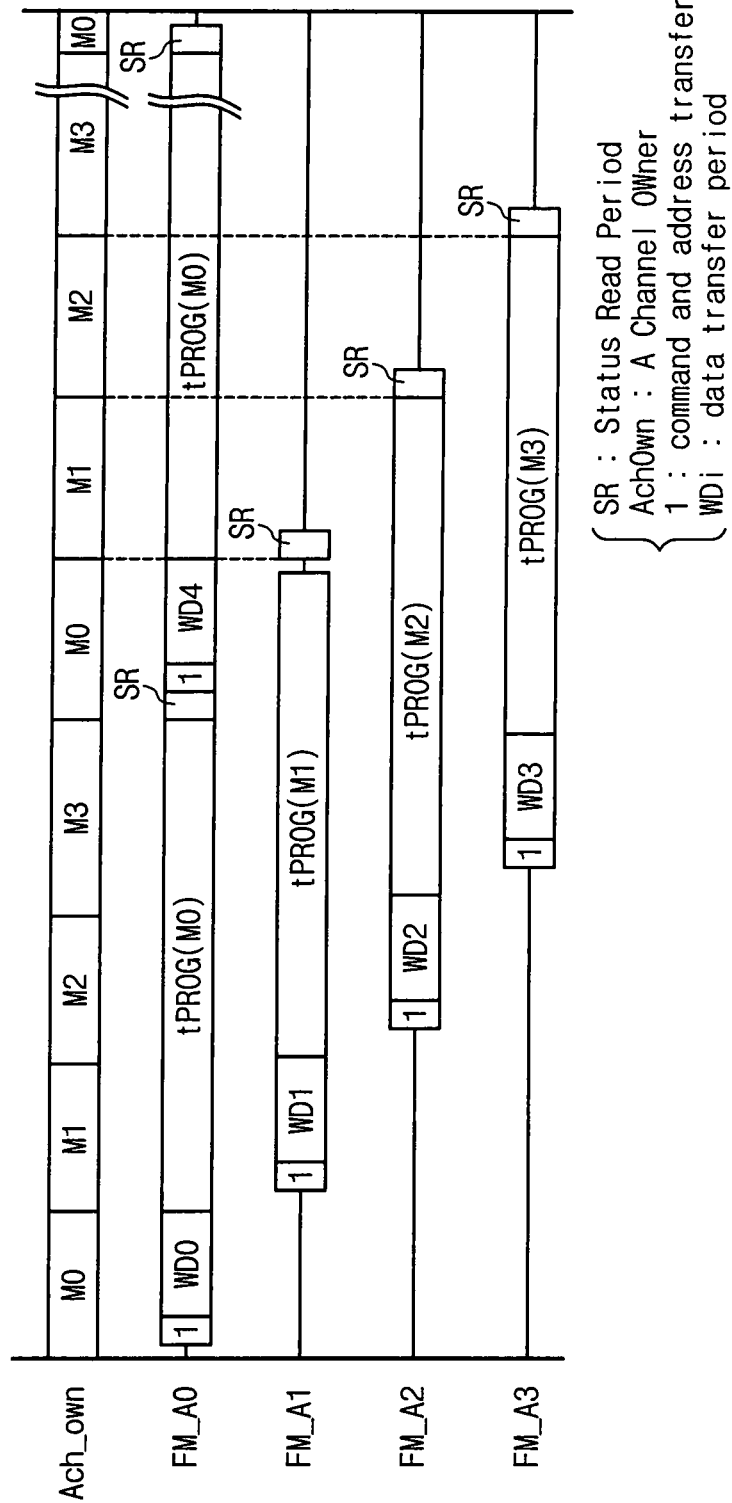
FIG. 7 to FIG. 9 are timing diagrams for describing a write procedure according to a 4-way interleave protocols.

Referring to FIG. 7, once a write command for any channel is written in the register 1801 of the flash interface control block 1800 by the CPU 1400, the flash interface control block 1800 continuously transfers data to be programmed to flash memories M0-M3 without intervention of the CPU 1400. For example, data to be programmed is continuously transferred to the flash memory M0 through a channel (that is, input/output lines) 1802 following a command and an address, and the transferred data is programmed in a memory cell array of the flash memory M0 during a predetermined time tPROG (M0). While a write operation for the flash memory M0 is carried out, as illustrated in FIG. 7, the flash interface control block 1800 transfers data to be programmed to the flash memory M1 through the channel (that is, input/output lines) 1802. Likewise, data to be programmed in the flash memories M2 and M3 is transferred in the same manner as described above. Accordingly, the channel is occupied by each of the flash memories M0-M3 during transferring of commands, addresses and data. In addition, the channel is occupied by each flash memory during a status read period for judging whether a write operation is passed or failed. Once all data is programmed, the flash interface control block 1800 informs the CPU 1400 that a write operation is ended. Data to be programmed in flash memories commonly connected to the channel is data read out from the buffer memory 1700.

Figure 8:
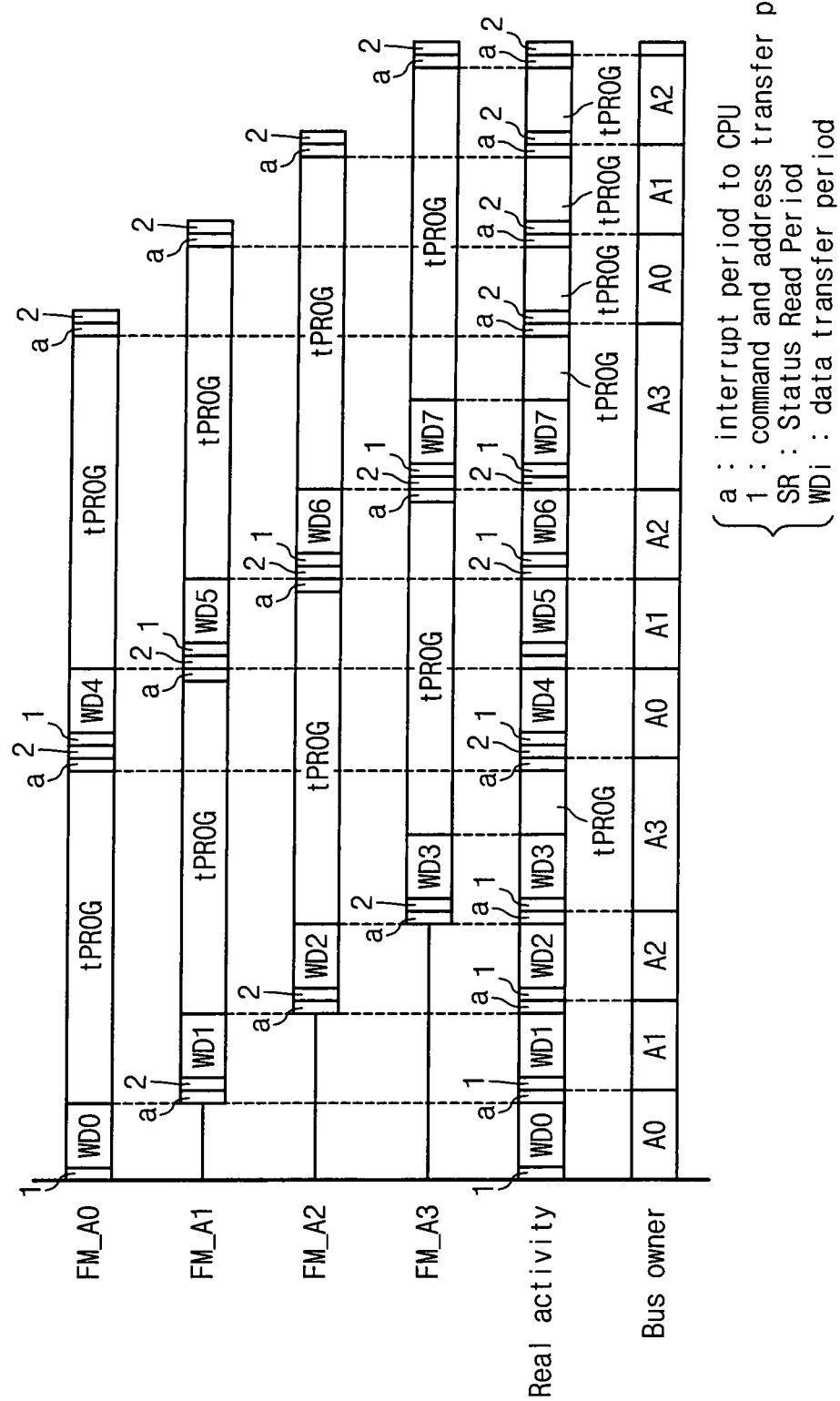

Below, a write operation of a software interleave protocol will be described with reference to FIG. 8. FIG. 8 is a timing diagram for describing a write operation according to 4-way interleaving under the assumption that a program time of a flash memory is maintained constant.

Referring to FIG. 8, once a write command for any channel is written in the register 1801 of the flash interface control block 1800 by the CPU 1400, the flash interface control block 1800 controls write operations of flash memories M0-M3 according to a control of the CPU 1400. For example, data WD0 to be programmed is sequentially transferred to the flash memory M0 through a channel (that is, input/output lines) 1802 following a command and an address. Once the data WD0 is transferred to the flash memory M0, the flash interface control block 1800 informs the CPU 1400 that transferring of data to the flash memory M0 is ended. The CPU 1400 stores in the register 1801 a write command together with information of a channel where program data is transferred. These steps (in FIG. 8, a period marked by 'a') are carried out within a period tPROG where data WD0 transferred to the flash memory M0 is programmed. If a write command is again written in the register 1801, the flash interface control block 1800 sequentially transfers program data WD1 to the flash memory M1 through a channel (that is, input/output lines) following a command and an address. Likewise, transferring of data to flash memories M2 and M3 is carried out in the same manner as described above, and description thereof is thus omitted.

Like the hardware interleave protocol, the channel is occupied sequentially by each flash memory during a period in which a command, an address and data are transferred. In addition, the channel is occupied by each flash memory during a status read period for judging whether a write operation is passed or failed.

Figure 9:
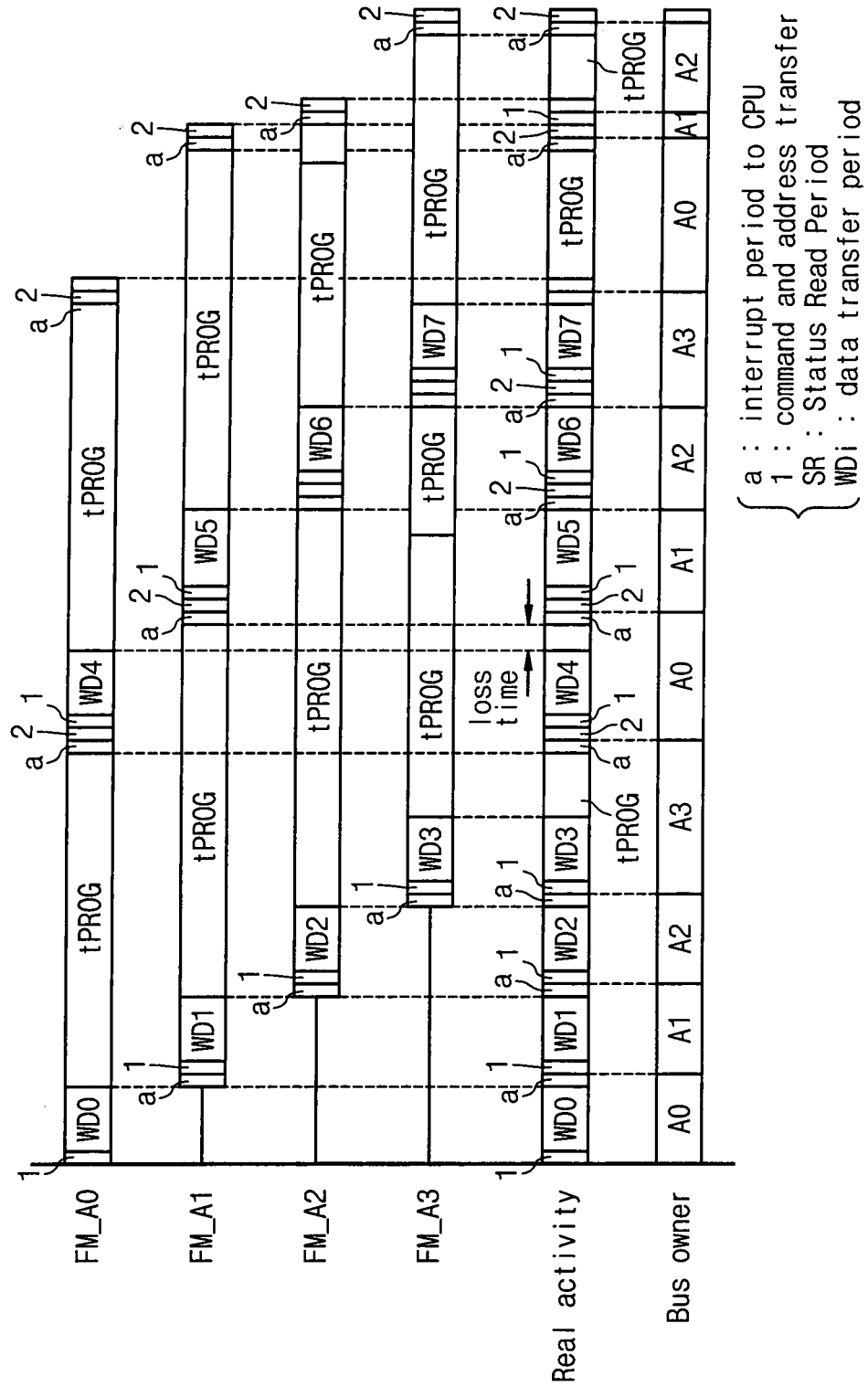

Unlike the above assumption that a program time of a flash memory is maintained constant, the program time tPROG of a flash memory is not maintained constant. That is, since program times of flash memories can be different, as illustrated in FIG. 9, time loss occurs during a write operation of the software interleave protocol.

Figure 10:
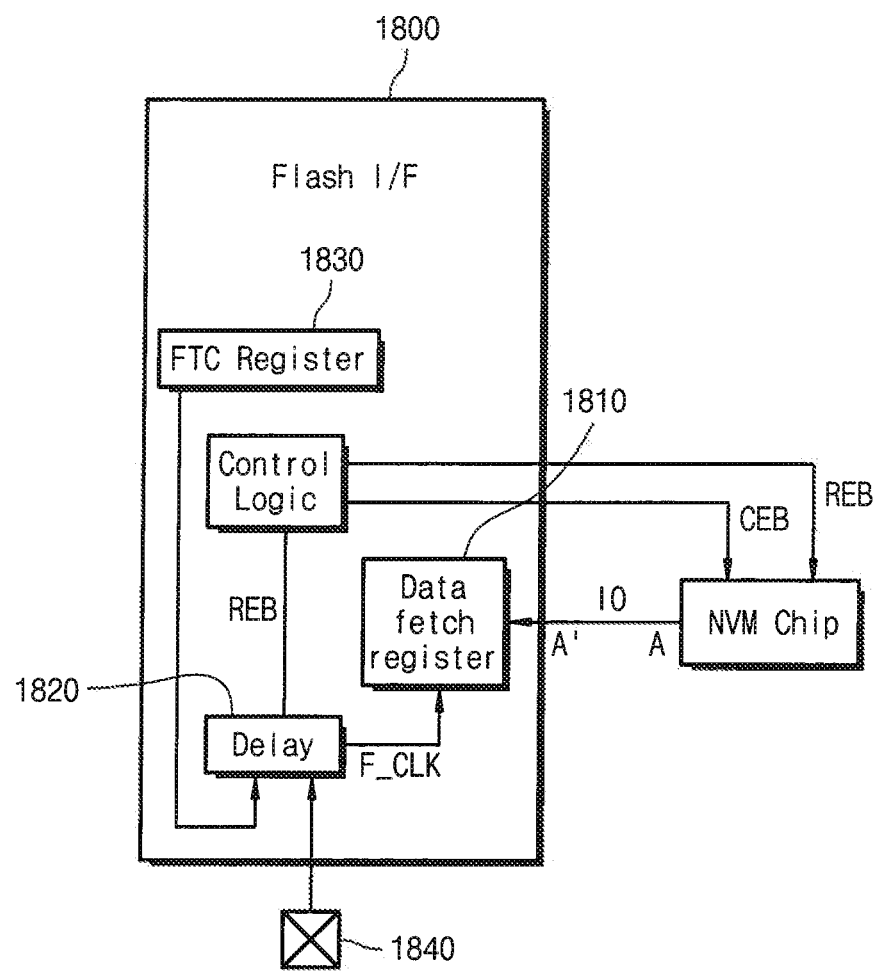
FIG. 10 is a block diagram showing a flash interface control block in FIG. 1.

FIG. 10 is a block diagram showing a flash interface control block in FIG. 1.

Figure 11:
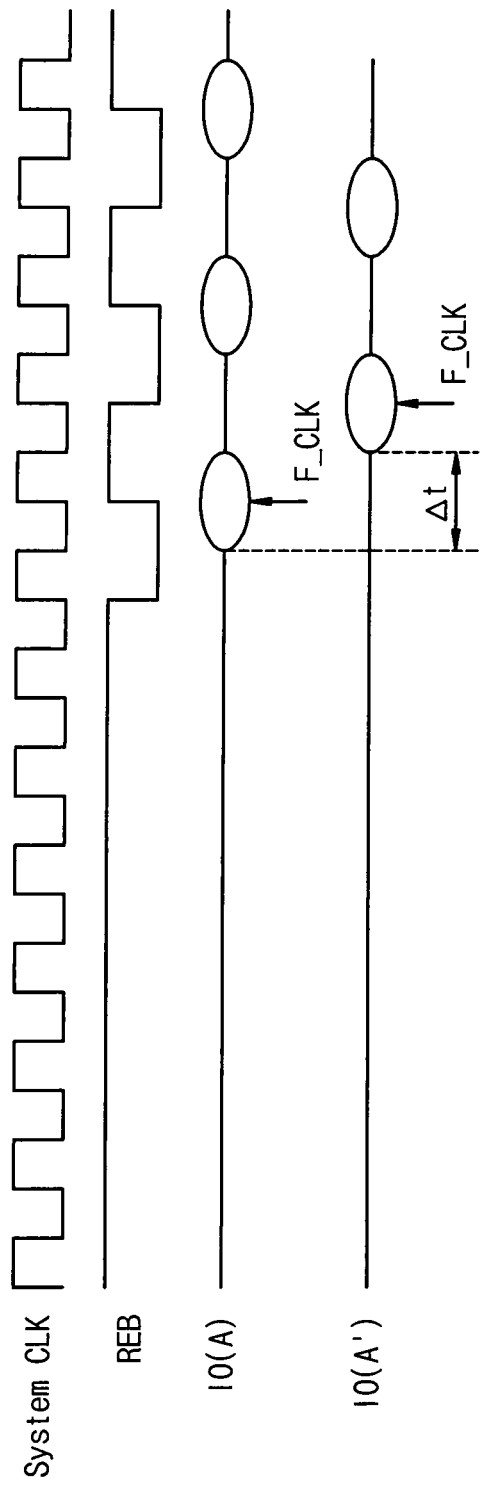
FIG. 11 is a timing diagram showing a fetch clock signal delayed by a delay circuit of a flash interface control block in FIG. 10.

As well know, data is transferred to a flash interface control block 1800 from a flash memory using a control signal such as REB. In this case, transferring of data to the flash interface control block 1800 from the flash memory is affected by line loading of input/output lines or flight time. That is, as illustrated in FIG. 10, a time for transferring data at a point A to a point A' is varied according to system configuration. In order to overcome this variation, it is preferable to adjust a fetch time of a fetch clock signal F_CLK for determining a data fetch timing of an internal data fetch register 1810. A delay circuit 1820 generates the fetch clock signal F_CLK in response to an REB signal applied to a flash memory, and the fetch clock signal FCLK is applied to a data fetch register 1810. In particular, a delay time of the delay circuit 1820 is adjusted by a value set in a register 1830 of the flash interface control block 1800 or by a value applied through an external pad 1840. As illustrated in FIG. 11, data, which is ATA point A and output in synchronization with the REB signal, reaches point A' after a delay time Δt. Accordingly, it is possible to stably fetch data transferred from a flash memory by delaying the REB signal by Δt and generating the fetch clock signal F CLK.

Figure 12:
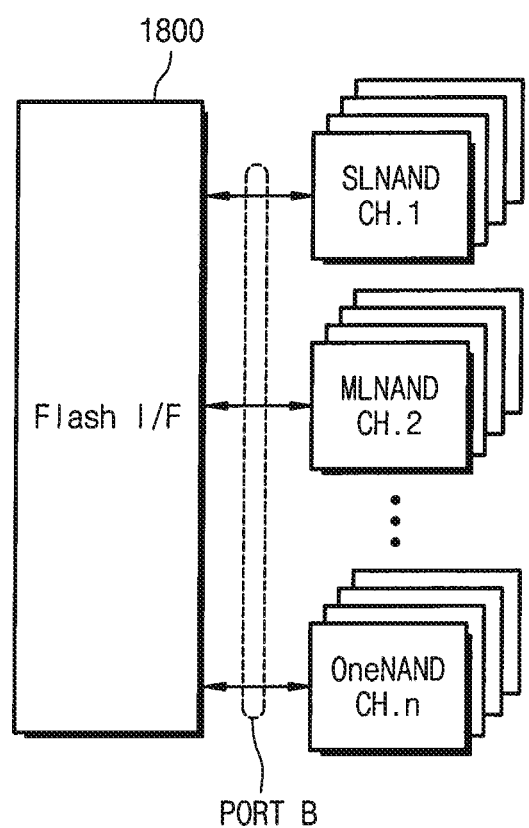
FIG. 12 is a block diagram showing memory types connected to channels of a flash interface control block.

FIG. 12 is a block diagram showing memory types that are capable of being connected to channels of a flash interface control block.

Referring to FIG. 12, one channel CH. 1 is commonly connected with NAND flash memories where I-bit data is stored in each cell, another channel CH. 2 is commonly connected with NAND flash memories where N-bit data is stored in each cell, and the other channel CH. nis commonly connected with OneNAND flash memories. But, it is readily apparent that different types of non-volatile memories can be connected to each channel.

Figure 13:
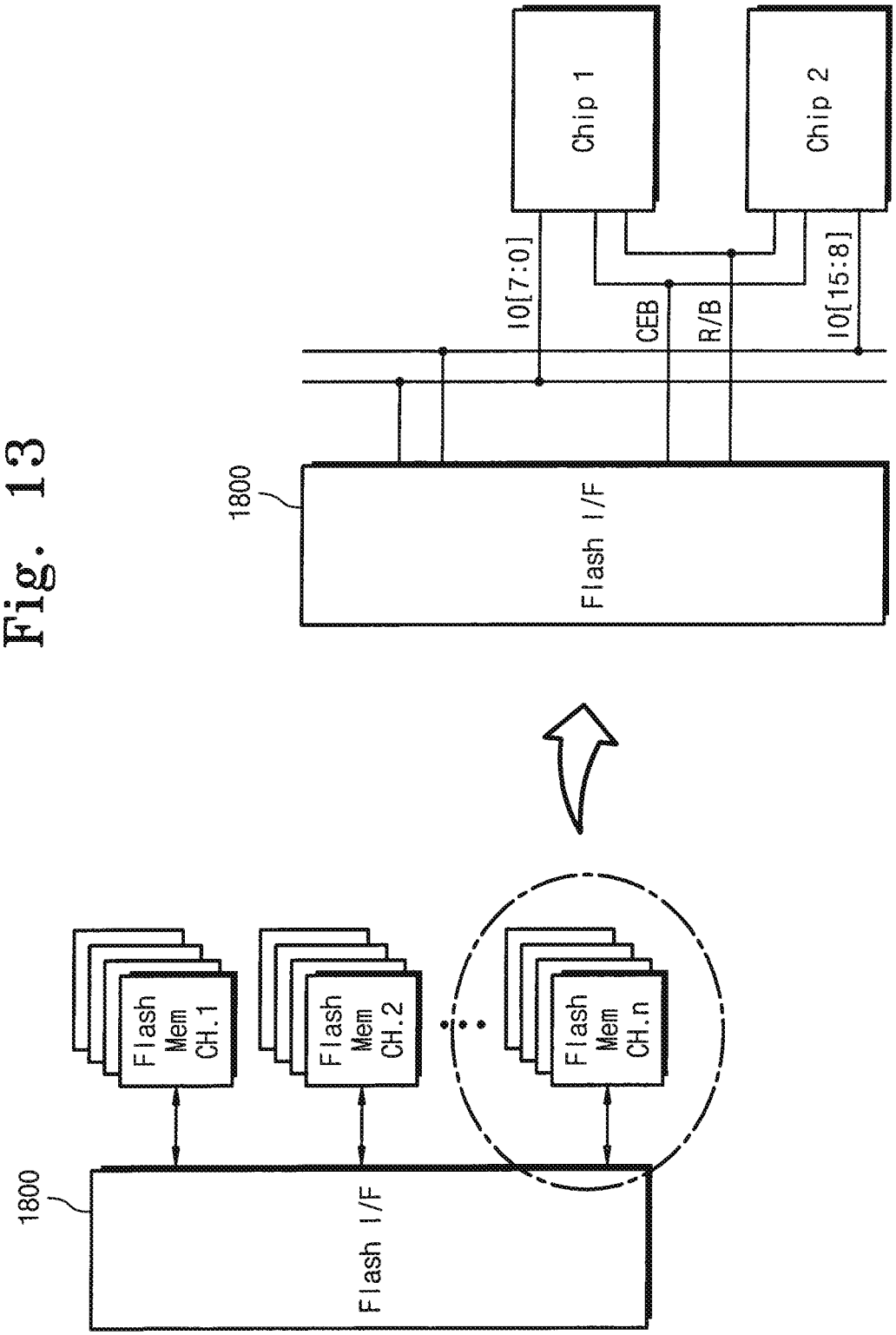
FIG. 13 is a block diagram showing another structure of a second channel supported by a solid state controller apparatus according to the present invention.

FIG. 13 is a block diagram showing another structure of a second channel supported by the solid state disk controller apparatus 1000.

Referring to FIG. 13, a flash memory having an input/output bit organization Of x16 is configured by parallel connecting two flash memories (chip 1 and chip 2) each having an input/output bit organization of x8. In accordance with this channel structure, it is possible to double the number of flash memories and a storage capability. One of two chips uses input/output lines 10[7:0], and the other uses input/output lines 10[15:8]. In this case, all control signals are shared by the chips.

As above described, as a data transfer operation of the solid state disk controller apparatus 1000 is carried out not through a CPU bus but through a FIFO path, a data transfer speed of the solid state disk controller apparatus is not affected by a CPU bus speed.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What I claim is:

1. A solid state drive comprising:
a plurality of nonvolatile memory devices;
a buffer memory;
a host interface circuit configured to interface signals including a command and data with an external host device;
a central processing unit CPU configured to control a read operation and a write operation of the solid state drive in response to the command received by the host interface circuit,
a first buffer circuit configured to interface the data between the host interface circuit and the buffer memory;
a flash interface circuit configured to control the plurality of nonvolatile memory devices under the control of the CPU;
a plurality of channels connected between the flash interface circuit and the plurality of nonvolatile memory devices, respectively;
a plurality of second buffer circuits configured to interface the data between the buffer memory and the flash interface circuit, the plurality of second buffer circuits corresponding to the plurality of nonvolatile memory devices respectively, and each communicating with a corresponding nonvolatile memory device over a respective one of the plurality of channels via the flash interface circuit; and
a plurality of error checking and correcting ECC circuits configured to detect and correct errors on the data transferred from the plurality of nonvolatile memory devices to the second buffer circuits, the plurality of ECC circuits corresponding to the plurality of second buffer circuits respectively;
wherein each of the channels corresponds to one of the plurality of nonvolatile memory devices, one of the plurality of ECC circuits and one of the plurality of second buffer circuits.

2. The solid state drive of claim 1, wherein the host interface circuit, the flash interface circuit, the plurality of second buffer circuits, the plurality of ECC circuits, and the CPU forms a controller configured to control the plurality of nonvolatile memory devices and the buffer memory.

3. The solid state drive of claim 1, wherein read data among the data for the read operation are transmitted to the host interface circuit from the buffer memory through the first buffer circuit and write data among the data for the write operation is transmitted to the buffer memory from the host interface circuit through the first buffer circuit.

4. The solid state drive of claim 1, wherein write data among the data for the write operation is transmitted the flash interface circuit from the buffer memory through the plurality of second buffer circuits and read data among the data for the read operation is transmitted to the buffer memory from the flash interface circuit during the read operation through the plurality of second buffer circuits.

5. The solid state drive of claim 1, further comprising:
an arbiter circuit configured to transmit write data among the data to the buffer memory from the first buffer circuit and transmit the write data to the second buffer circuit from the buffer memory during the write operation, and transmit read data among the data to the buffer memory from the second buffer circuit and transmit the read data to the first buffer circuit from the buffer memory during the read operation.

6. The solid state drive of claim 5, wherein a first bandwidth between the arbiter circuit and the first buffer circuit is different from a second bandwidth between the arbiter circuit and the plurality of second buffer circuits.

7. The solid state drive of claim 5, wherein a first bandwidth between the first buffer circuit and the host interface circuit is different from a second bandwidth between the first buffer circuit and the arbiter circuit.

8. The solid state drive of claim 5, wherein a first bandwidth between the plurality of second buffer circuits and the arbiter circuits is different from a second bandwidth between the plurality of second buffer circuits and the flash interface circuits.

9. The solid state drive of claim 1, wherein the CPU is connected to the host interface circuit and the flash interface circuit through a command bus and configured to control the host interface circuit and the flash interface circuit through the command bus,
wherein the command bus is isolated from a first data path where the data is transferred between the host interface circuit and the buffer memory, the first data path including the first buffer circuit,
wherein the command bus is isolated from a second data path where the data is transferred between the flash interface circuit and the buffer memory, the second data path including the plurality of second buffer circuits.

10. The solid state drive of claim 1, wherein each of the nonvolatile memory devices corresponding to one of the channels comprises at least two nonvolatile memory chips,
wherein each of the at least two nonvolatile memory chips drives its own Ready/Busy signal to the flash interface circuit.

11. The solid state drive of claim 10, wherein at least two nonvolatile memory chips of each of the plurality of nonvolatile memory chips are connected commonly to transmit the data to the flash interface circuit.

12. The solid state drive of claim 10, wherein the flash interface circuit is configured to transmit first write data to one of the at least two nonvolatile memory chips in one of the nonvolatile memory devices and transmit second write data to other nonvolatile memory chips in the one of the nonvolatile memory devices during the first data are programmed at the one nonvolatile memory chip.

13. The solid state drive of claim 1, wherein each of the plurality of nonvolatile memory devices comprises at least two nonvolatile memory chips,
wherein the flash interface circuit is configured to control chip enable signals of the at least two nonvolatile memory chips of each of the plurality of nonvolatile memory devices in common via a common chip enable signal line.

14. The solid state drive of claim 13, wherein the flash interface circuit is configured to receive Ready/Busy signals from the at least two nonvolatile memory chips of each of the plurality of nonvolatile memory devices in common via a common Ready/Busy signal line.

15. The solid state drive of claim 13, wherein the flash interface circuit is configured to communicate data with the at least two nonvolatile memory chips of each of the plurality of nonvolatile memory devices through separate data lines.

16. The solid state drive of claim 1, wherein the host interface circuit includes a register configured to store the command received from an external device,
wherein the CPU is configured to read the command from the register.

17. The solid state drive of claim 1, wherein the plurality of second buffer circuits includes a plurality of FIFOs.

* * * * *